(12) United States Patent
Ahn et al.

(10) Patent No.: US 7,220,612 B2
(45) Date of Patent: May 22, 2007

(54) LIQUID CRYSTAL DISPLAY DEVICE AND FABRICATING METHOD THEREOF

(75) Inventors: Byung Chul Ahn, Anyang-si (KR); Joo Soo Lim, Gumi-si (KR); Byung Ho Park, Pohang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/168,313

(22) Filed: Jun. 29, 2005

(65) Prior Publication Data
US 2006/0138417 A1   Jun. 29, 2006

(30) Foreign Application Priority Data
Dec. 24, 2004   (KR) ...................... 10-2004-0112586

(51) Int. Cl.
*H01L 21/336* (2006.01)

(52) U.S. Cl. .......................... 438/30; 438/38; 438/951; 257/E21.025; 257/E21.036; 257/E21.235

(58) Field of Classification Search .................. 438/30, 438/38, 951, FOR. 455; 257/E21.411, E21.025, 257/E21.038, E21.235
See application file for complete search history.

(56) References Cited

U.S. PATENT DOCUMENTS

| | | | | |
|---|---|---|---|---|
| 4,396,458 | A | * | 8/1983 | Platter et al. .................. 216/19 |
| 4,440,804 | A | * | 4/1984 | Milgram ...................... 438/670 |
| 4,601,097 | A | * | 7/1986 | Shimbo ....................... 438/159 |
| 4,830,986 | A | * | 5/1989 | Plumb .......................... 438/38 |
| 5,162,933 | A | | 11/1992 | Kakuda et al. |
| 5,317,433 | A | | 5/1994 | Miyawaki et al. |
| 5,339,181 | A | | 8/1994 | Kim et al. |
| 5,462,887 | A | | 10/1995 | Gluck |
| 5,668,379 | A | | 9/1997 | Ono et al. |
| 5,731,856 | A | | 3/1998 | Kim et al. |
| 5,771,083 | A | | 6/1998 | Fujihara et al. |
| 5,793,460 | A | | 8/1998 | Yang |
| 5,847,781 | A | | 12/1998 | Ono et al. |
| 7,078,279 | B2 | * | 7/2006 | Yoo et al. .................... 438/155 |

* cited by examiner

*Primary Examiner*—George Fourson
(74) *Attorney, Agent, or Firm*—McKenna Long & Aldridge LLP

(57) ABSTRACT

A thin film transistor substrate and a fabricating method thereof for simplifying a process are disclosed. In a liquid crystal display device according to the present invention, a gate line is provided on a substrate. A data line crosses the gate line with having a gate insulating film therebetween to define a pixel area. A thin film transistor includes a gate electrode connected to the gate line, a source electrode connected to the data line, a drain electrode opposed to the source electrode and a semiconductor layer for defining a channel between the source electrode and the drain electrode. A pixel electrode is connected to the drain electrode and is provided at said pixel area. Herein, said data line, said source electrode and said drain electrode have a double-layer structure in which a source/drain metal pattern and a transparent conductive pattern are built. Said pixel electrode is formed by an extension of the transparent conductive pattern of the drain electrode. A protective film makes a border with the transparent conductive pattern and provided at the remaining area thereof.

12 Claims, 20 Drawing Sheets

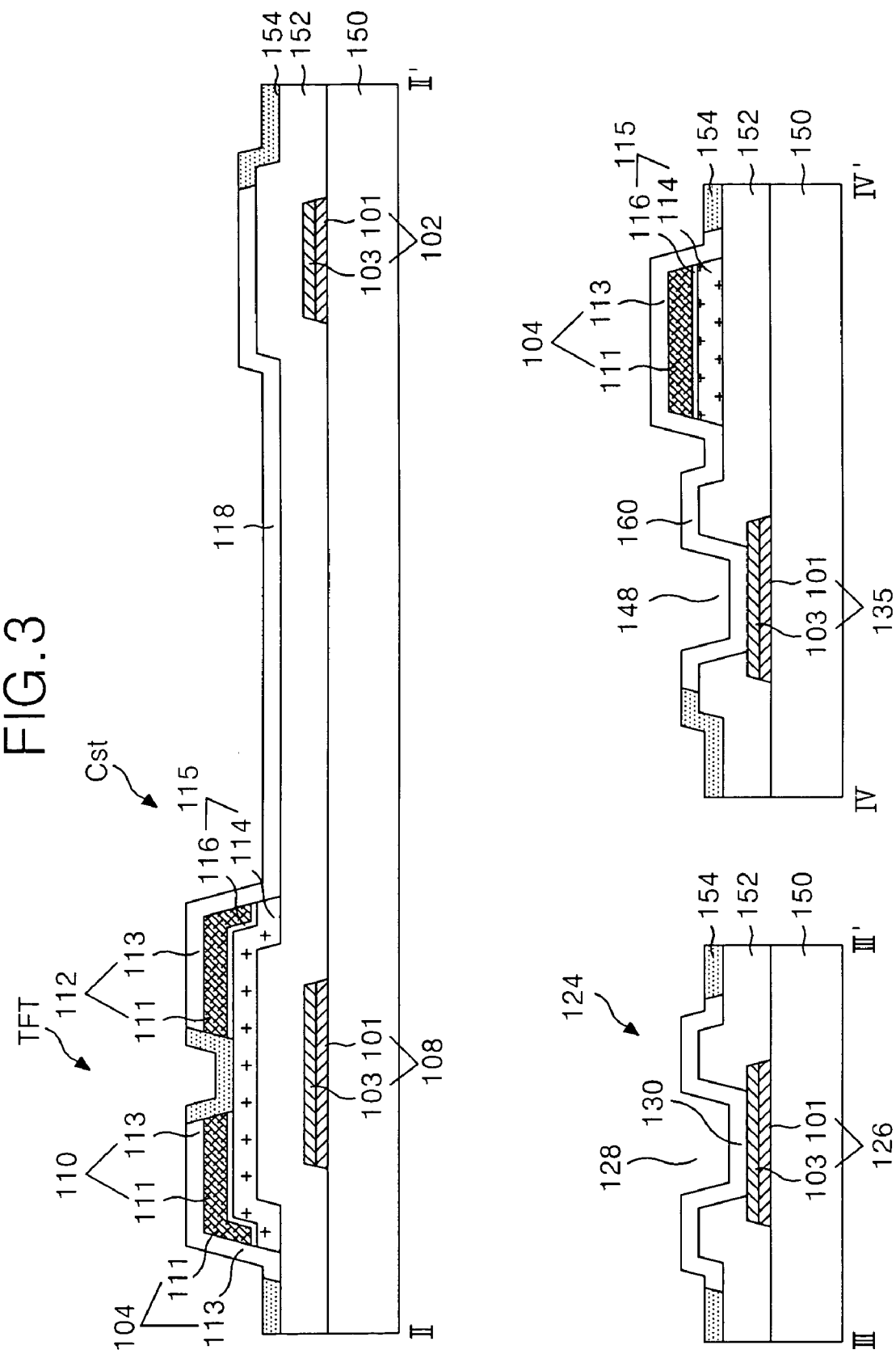

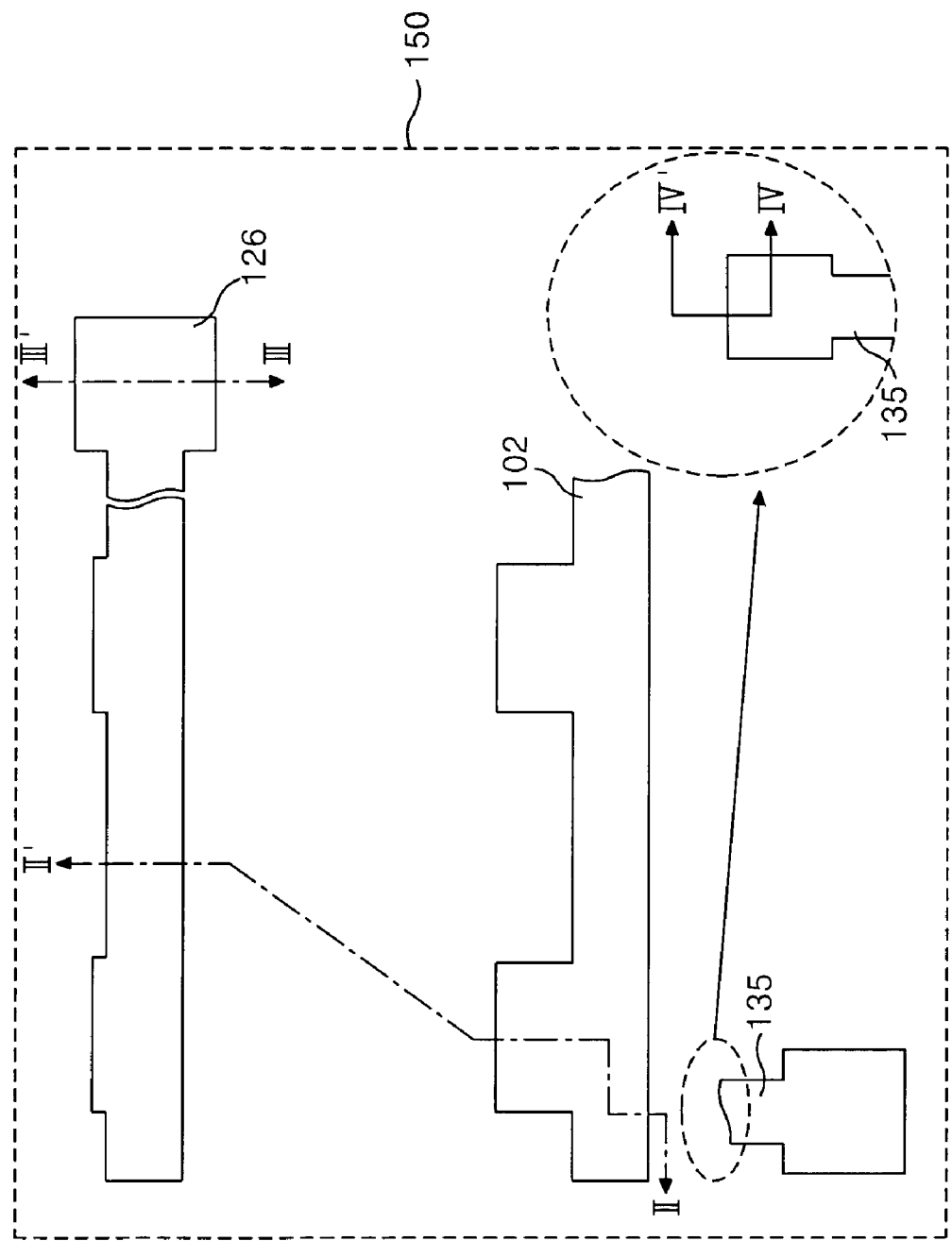

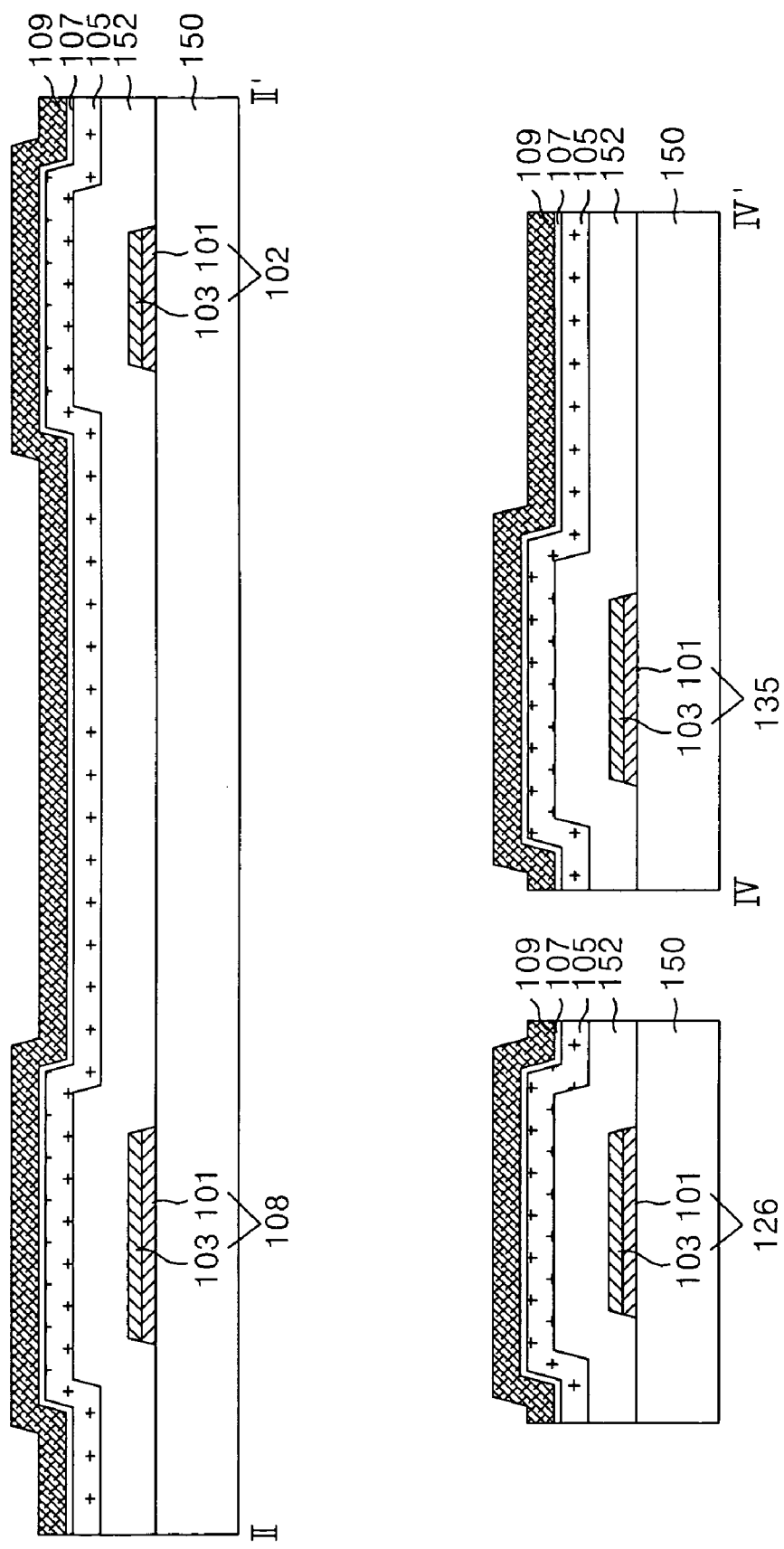

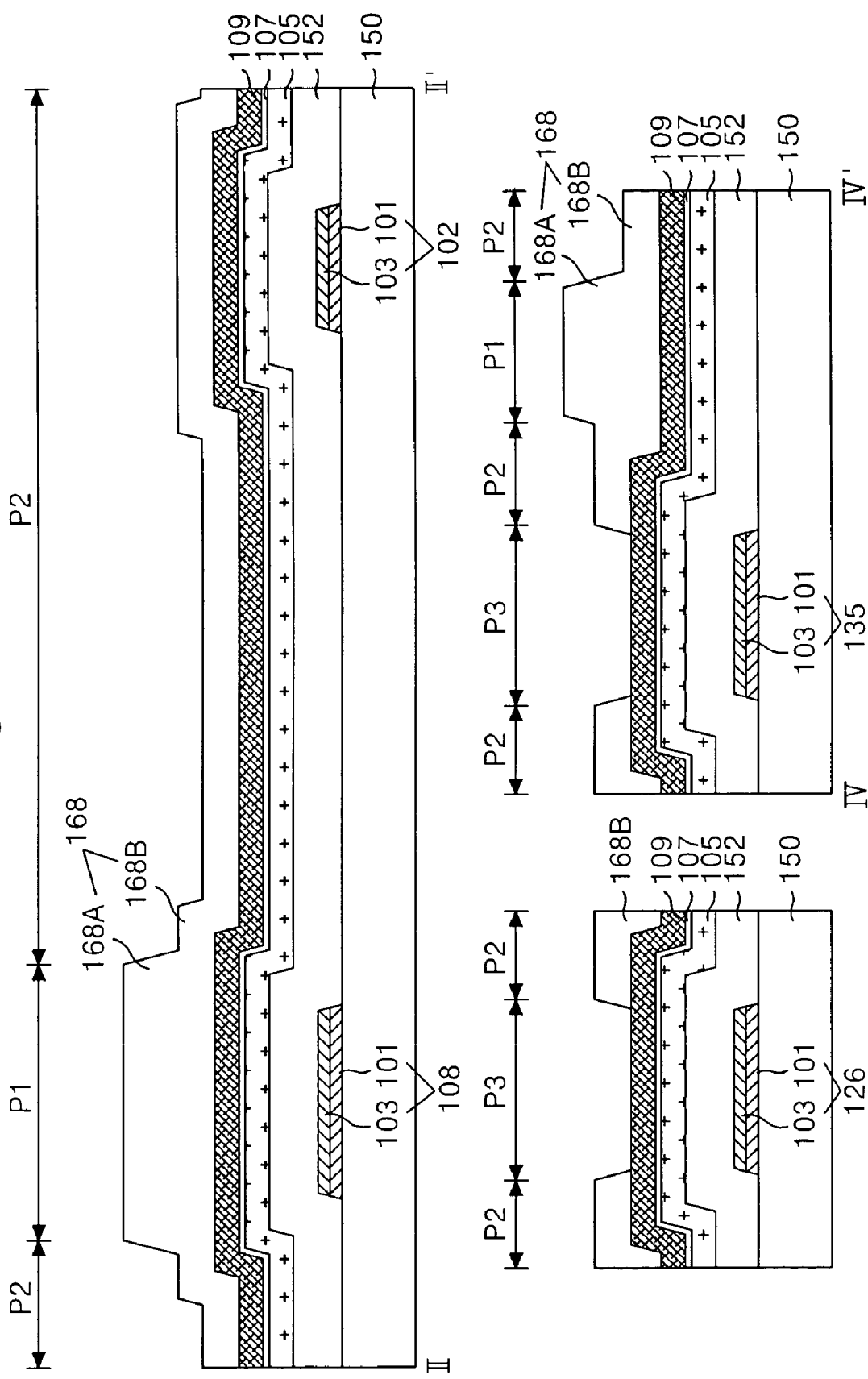

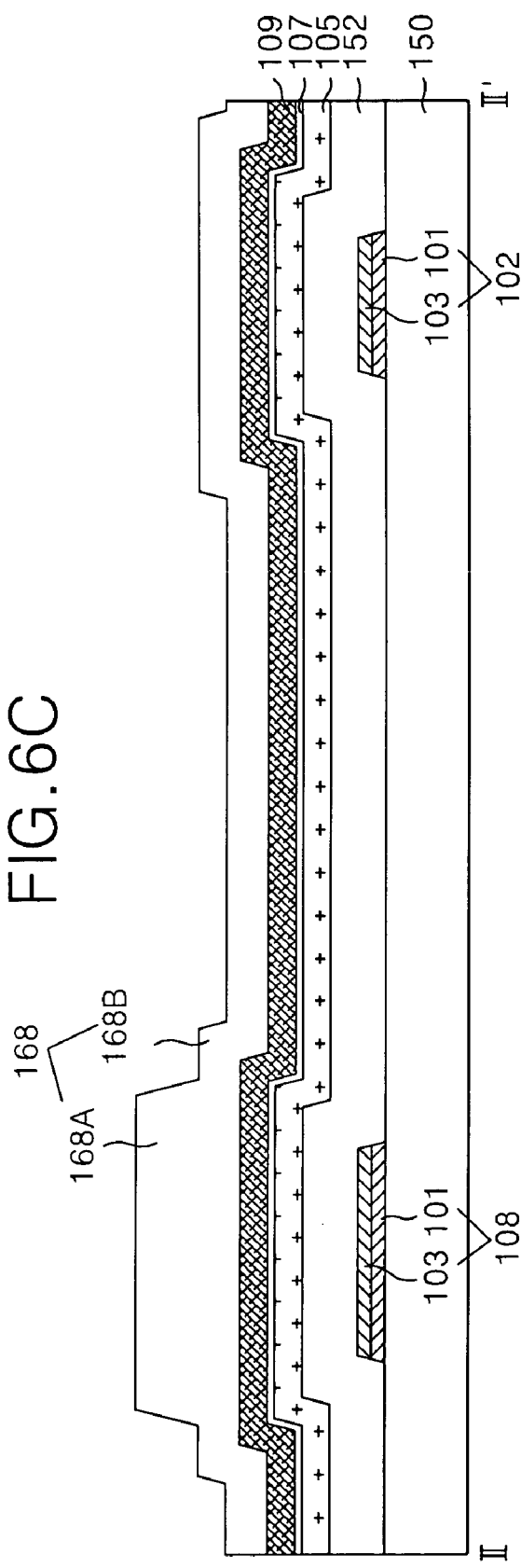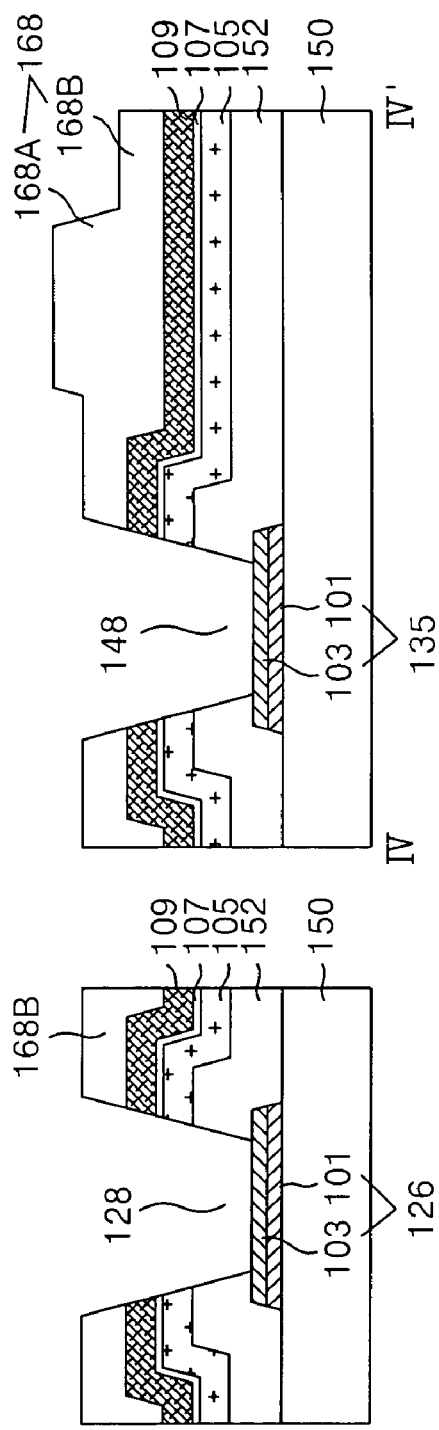

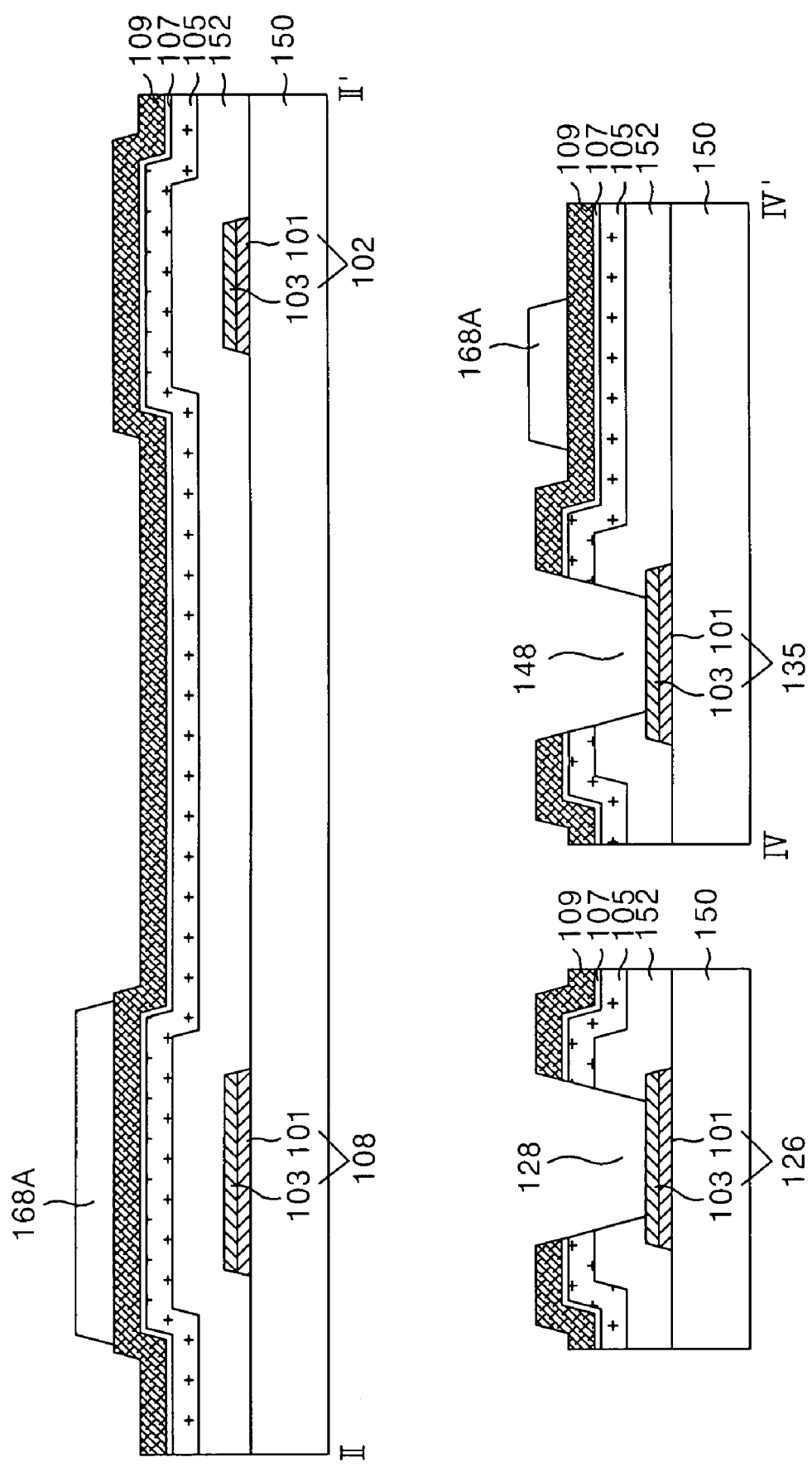

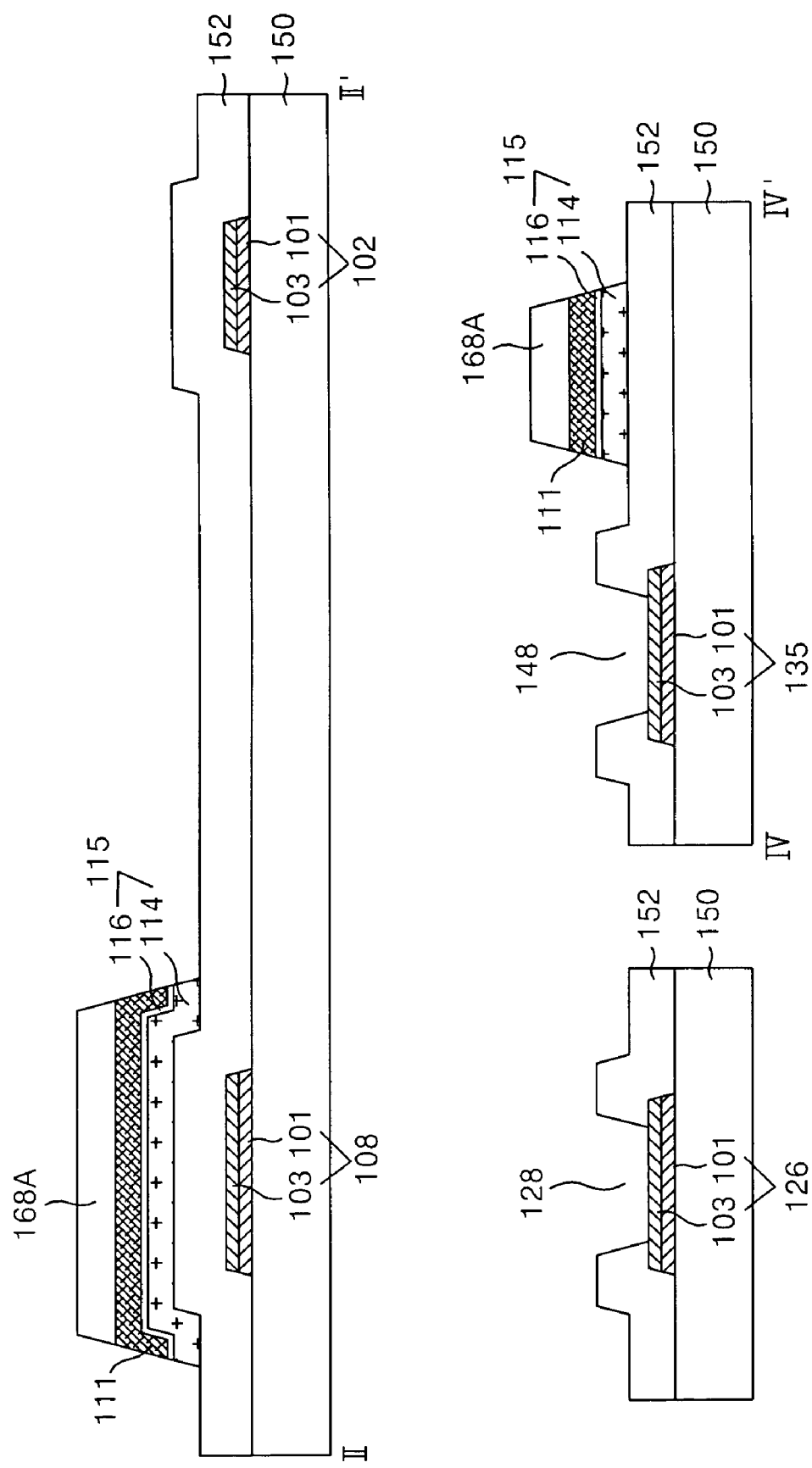

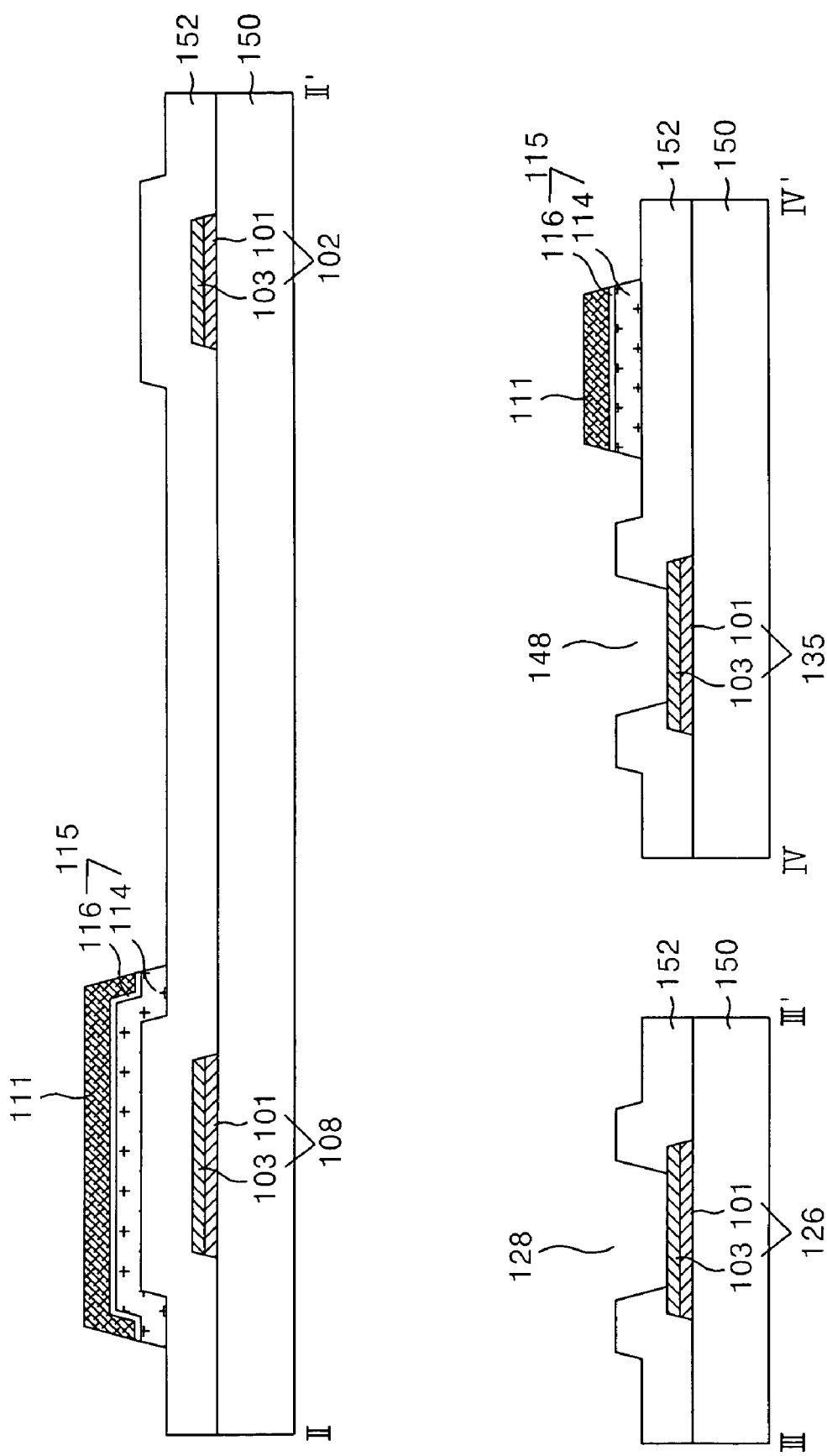

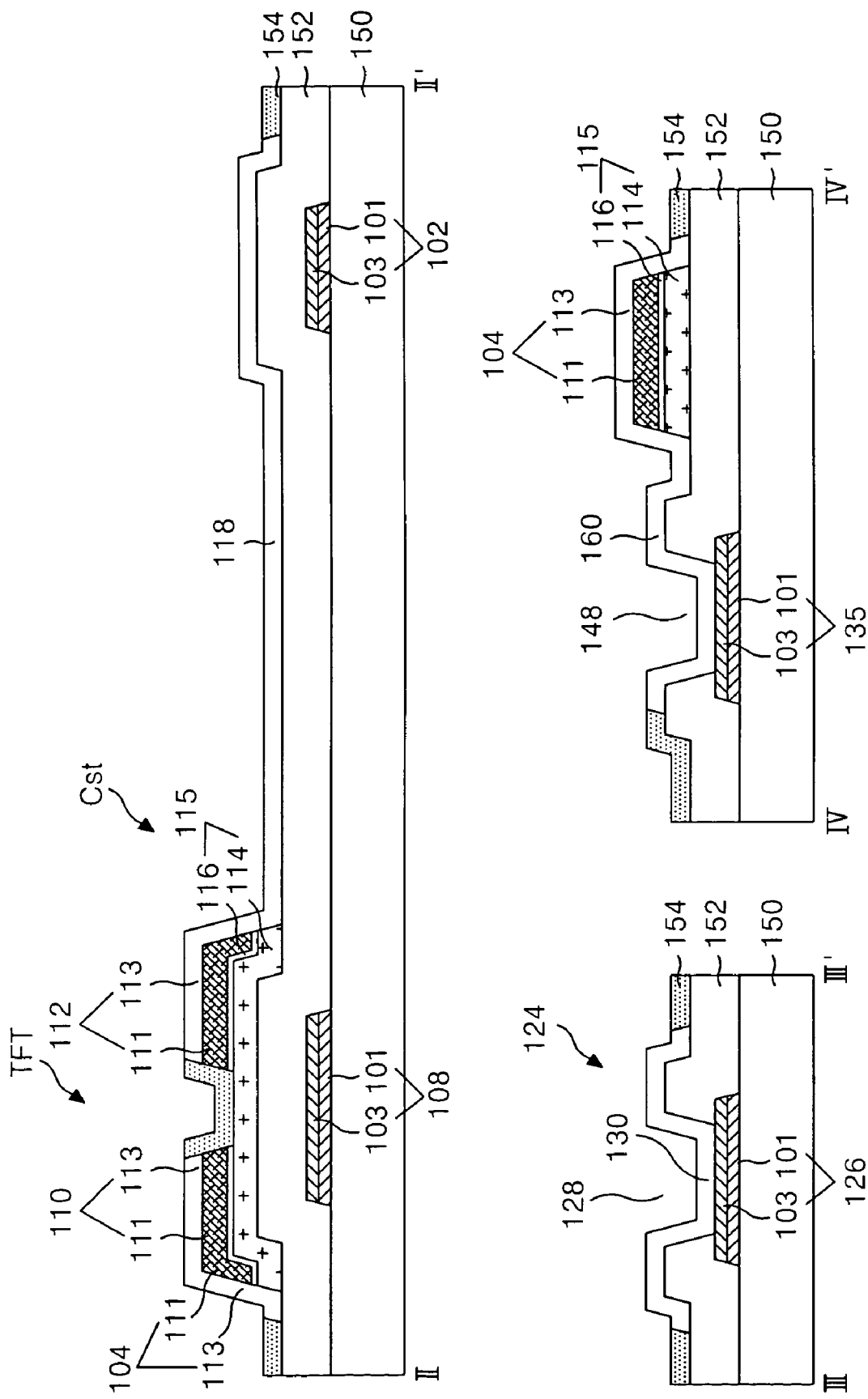

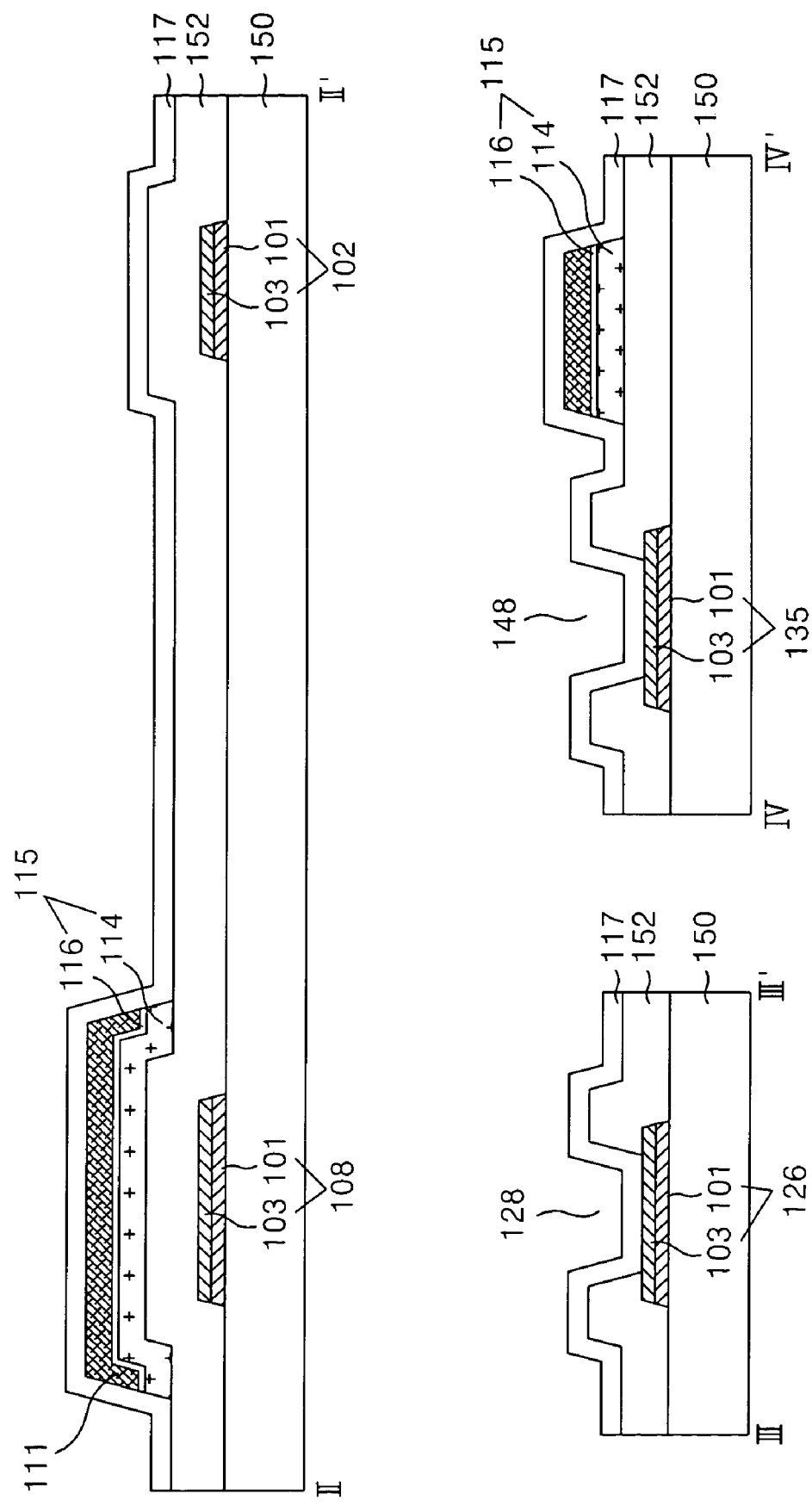

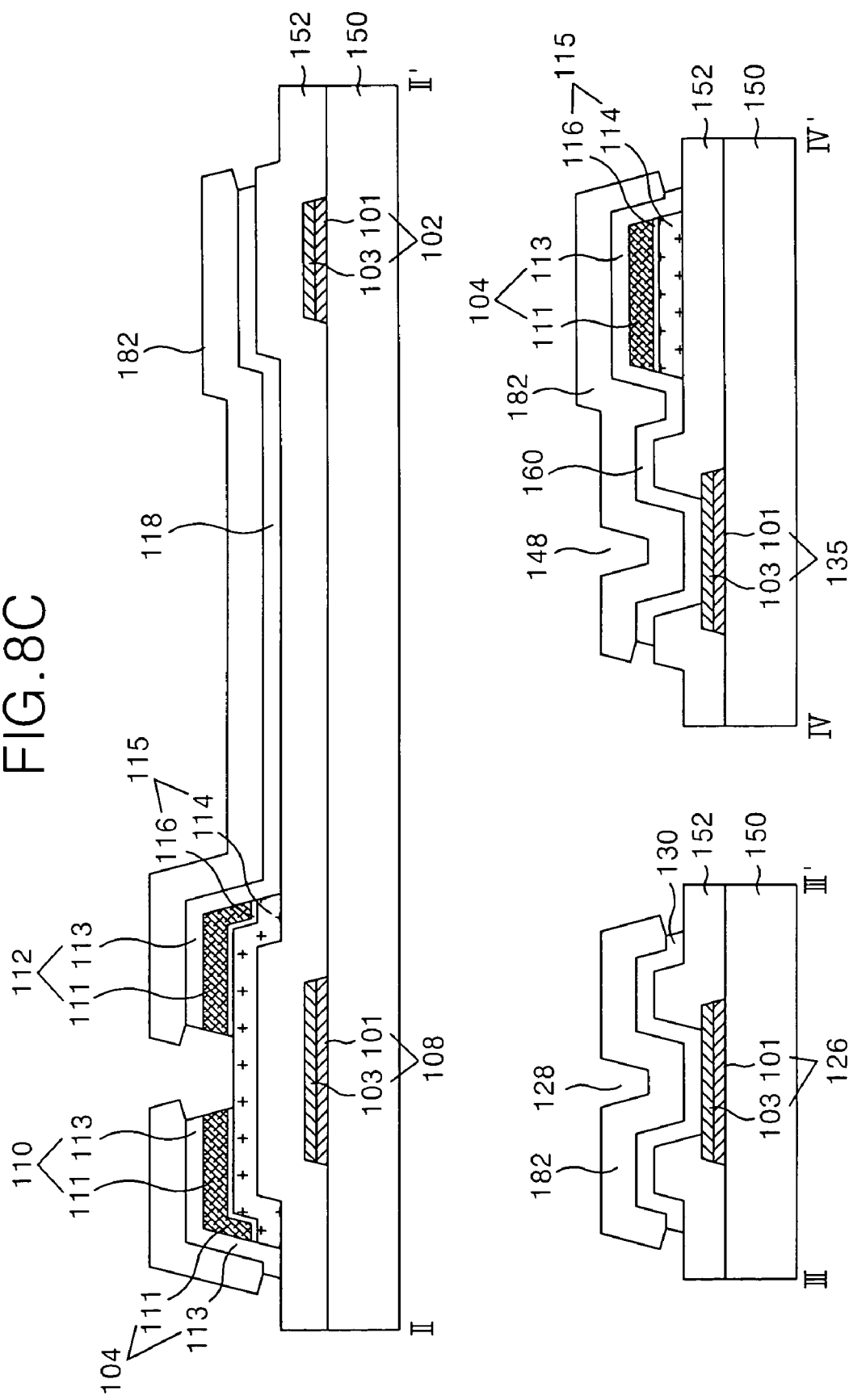

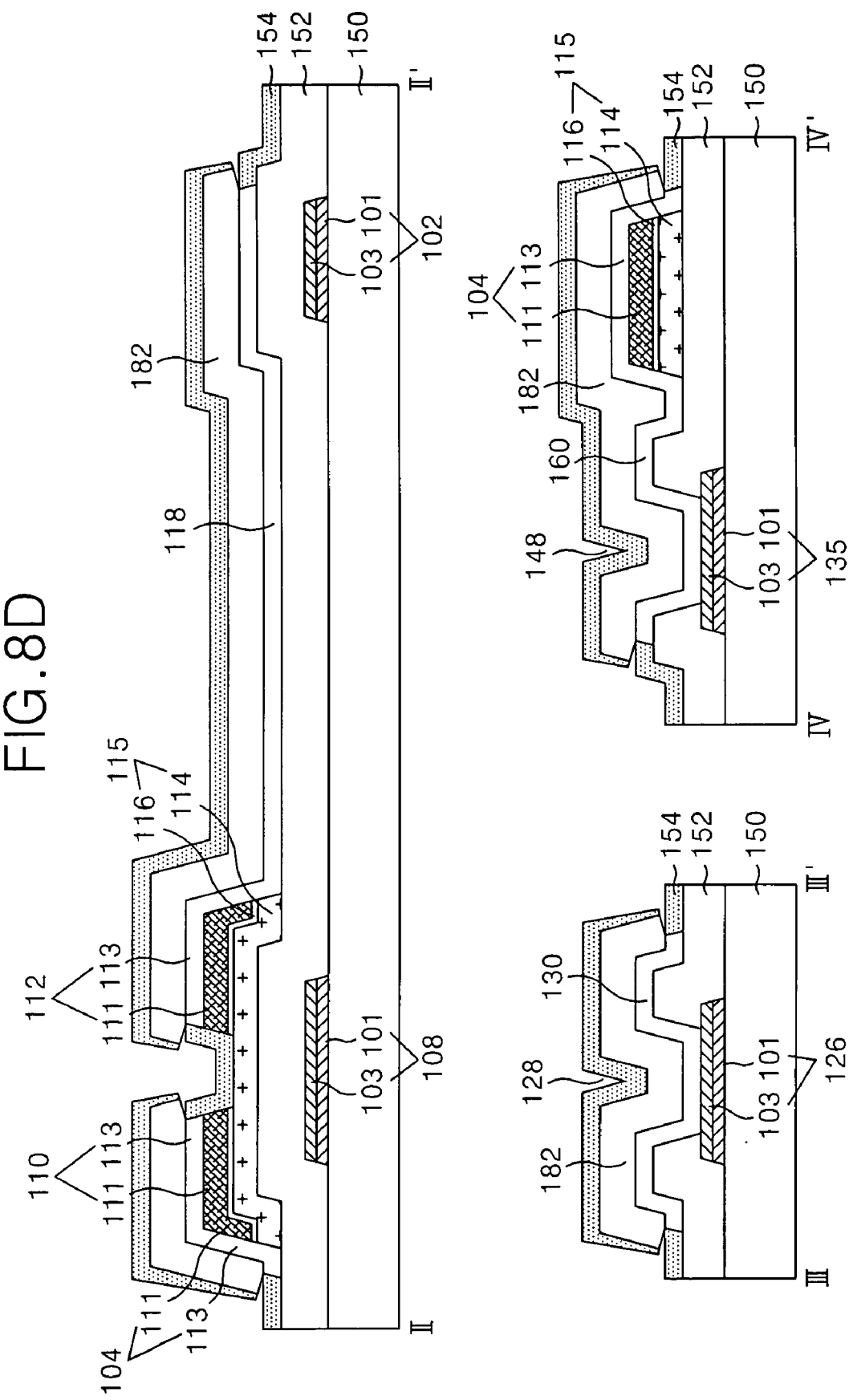

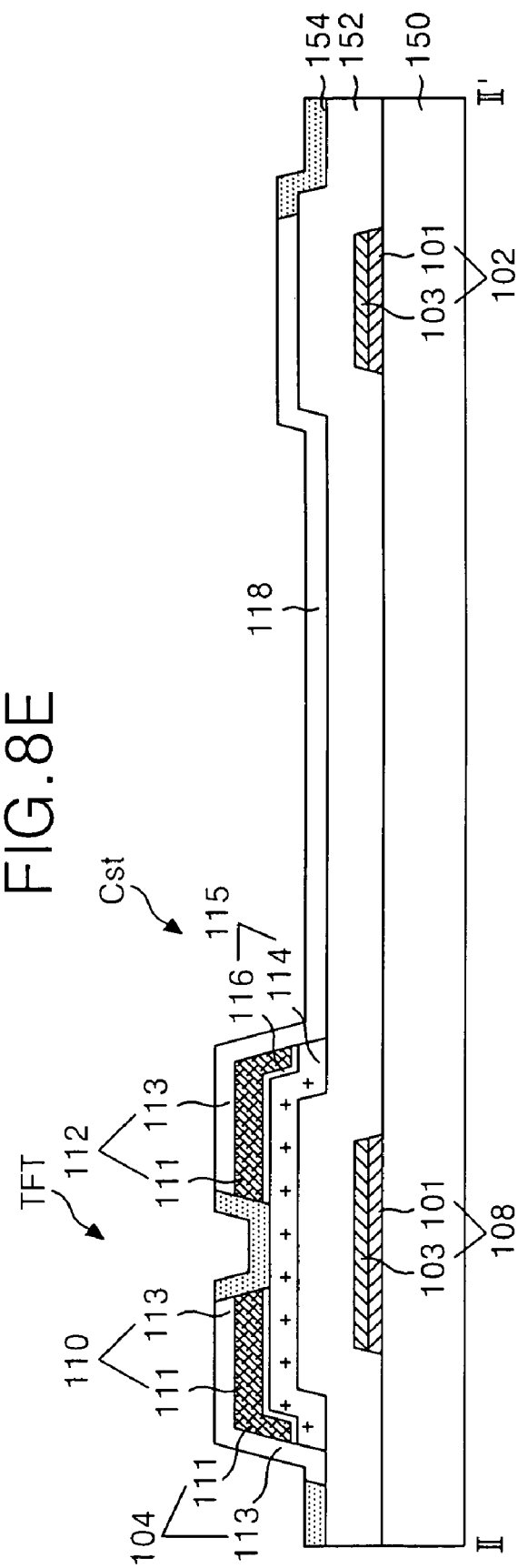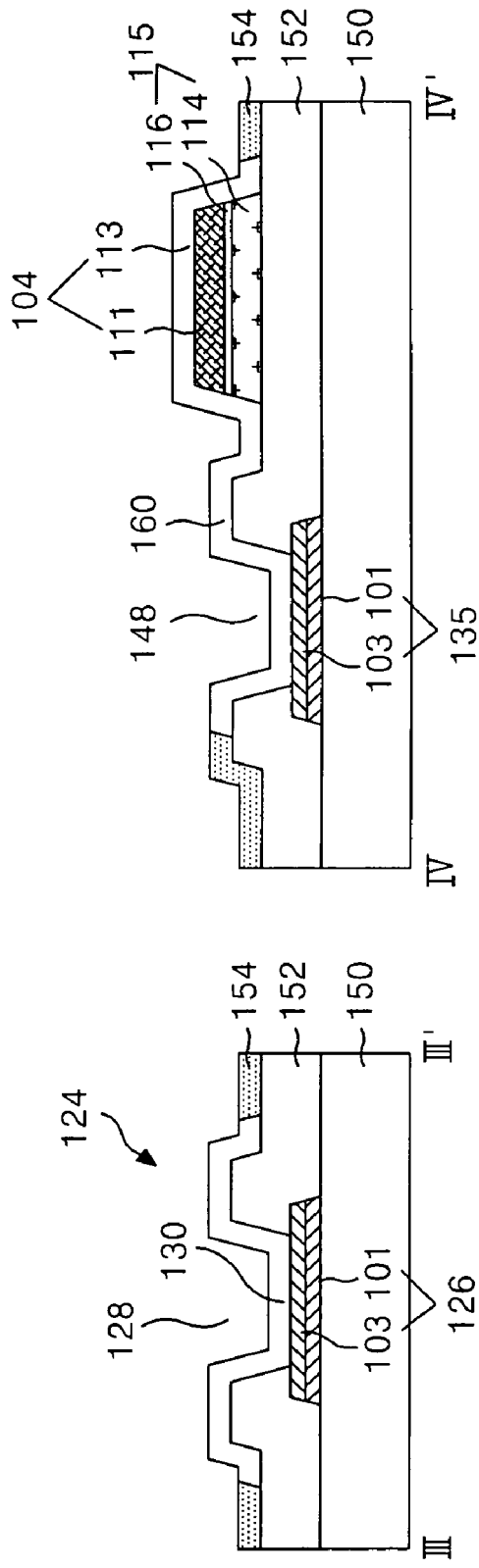
FIG.8E

LIQUID CRYSTAL DISPLAY DEVICE AND FABRICATING METHOD THEREOF

This application claims the benefit of Korean Patent Application No. P2004-112586 filed in Korea on Dec. 24, 2004, which is hereby incorporated by reference for all purposes as if fully set forth herein.

BACKGROUND OF THE INVENTION

1. Field of the Invention

This invention relates to a liquid crystal display, and more particularly to a thin film transistor substrate and a fabricating method thereof that are adaptive for simplifying a process.

2. Discussion of the Related Art

Generally, a liquid crystal display (LCD) controls light transmittance of a liquid crystal having a dielectric anisotropy using an electric field to thereby display a picture. To this end, the LCD includes a liquid crystal display panel for displaying a picture by a liquid crystal cell matrix, and a driving circuit for driving the liquid crystal display panel.

Referring to FIG. 1, a related art liquid crystal display panel is comprised of a color filter substrate 10 and a thin film transistor substrate 20 that are joined to each other with having a liquid crystal 24 therebetween.

The color filter substrate 10 includes a black matrix 4, a color filter 6 and a common electrode 8 that are sequentially provided on an upper glass substrate 2. The black matrix 4 is provided in a matrix type on the upper glass substrate 2. The black matrix 4 divides an area of the upper glass substrate 2 into a plurality of cell areas to be provided with the color filter 6, and prevents a light interference between adjacent cells and an external light reflection. The color filter 6 is provided at the cell area divided by the black matrix 4 in such a manner to be divided into red(R), green(G) and blue(B) ones, thereby transmitting red, green and blue lights. The common electrode 8 is formed from a transparent conductive layer entirely coated onto the color filter 6, and supplies a common voltage Vcom that serves as a reference voltage upon driving of the liquid crystal 24. Further, an over-coated layer (not illustrated) for smoothing the color filter 6 may be provided between the color filter 6 and the common electrode 8.

The thin film transistor substrate 20 includes a thin film transistor 18 and a pixel electrode 22 provided for each cell area defined by an crossing between a gate line 14 and a data line 16 at a lower glass substrate 12. The thin film transistor 18 applies a data signal from the data line 16 to the pixel electrode 22 in response to a gate signal from the gate line 14. The pixel electrode 22 formed from a transparent conductive layer supplies a data signal from the thin film transistor 18 to drive the liquid crystal 24.

The liquid crystal 24 having a dielectric anisotropy is rotated in accordance with an electric field formed by a data signal from the pixel electrode 22 and a common voltage Vcom from the common electrode 8 to control light transmittance, thereby implementing a gray scale level.

Further, the liquid crystal display panel includes a spacer (not illustrated) for constantly keeping a cell gap between the color filter substrate 10 and the thin film transistor substrate 20.

In such a liquid crystal display panel, the color filter substrate 10 and the thin film transistor substrate 20 are formed by a plurality of mask processes. Herein, one mask process includes a lot of processes such as thin film deposition (coating), cleaning, photolithography, etching, photoresist stripping and inspection processes, etc.

Particularly, because the thin film transistor substrate includes the semiconductor process and requires a plurality of mask processes, it has a complicated fabricating process which is major factor in the increased manufacturing cost of liquid crystal display panels. Therefore, the thin film transistor substrate has been developed to reduce the number of mask process.

It is to be understood that both the foregoing general description and the following detailed description are exemplary and explanatory and are intended to provide further explanation of the invention as claimed.

SUMMARY OF THE INVENTION

Accordingly, it is an advantage of the present invention to provide a thin film transistor substrate and a fabricating method thereof that are adaptive for simplifying a process.

In order to achieve these and other advantages of the invention, a liquid crystal display device according to one aspect of the present invention comprises a gate line on a substrate; a data line crossing the gate line having a gate insulating film there between to define a pixel area; a thin film transistor including a gate electrode, a source electrode, a drain electrode and a semiconductor layer for defining a channel between the source electrode and the drain electrode; and a pixel electrode connected to the drain electrode, wherein the data line, the source electrode and the drain electrode include a double-layer structure having a source and drain metal pattern and a transparent conductive pattern, the pixel electrode is formed by an extension of the transparent conductive pattern of the drain electrode, and a protective film having a border with the transparent conductive pattern and in the remaining area thereof.

A method of fabricating a liquid crystal display device according to another aspect of the present invention comprises a first mask process of forming a gate line and a gate electrode connected to the gate line on a substrate; a second mask process of forming a gate insulating film on the gate line and the gate electrode and a semiconductor pattern and a source and drain metal pattern; and a third mask process of forming a transparent conductive pattern on the source and drain metal pattern and forming a protective film having a border with the transparent conductive pattern, wherein a data line crossing the gate line to define a pixel area, a source electrode and a drain electrode include a double-layer structure having the source and drain metal pattern and the transparent conductive pattern, and a pixel electrode extended from the transparent conductive pattern of the drain electrode is provided in the pixel area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a section view of the thin film transistor substrate taken along the II–II', III–III' and IV–IV' lines in FIG. 2;

FIG. 4A and FIG. 4B are a plan view and a section view illustrating a first mask process in a method of fabricating the thin film transistor substrate according to the embodiment of the present invention, respectively;

FIG. 6A to FIG. 6F are section views for specifically explaining the second mask process;

FIG. 7A and FIG. 7B are a plan view and a section view illustrating a third mask process in a method of fabricating the thin film transistor substrate according to the embodiment of the present invention, respectively; and FIG. 8A to FIG. 8E are section views for specifically explaining the third mask process.

DETAILED DESCRIPTION OF THE ILLUSTRATED EMBODIMENTS

Reference will now be made in detail to embodiments of the present invention, examples of which are illustrated in the accompanying drawings.

Hereinafter, exemplary embodiments of the present invention will be described in detail with reference to FIGS. 2 to 8E.

Figure 1:
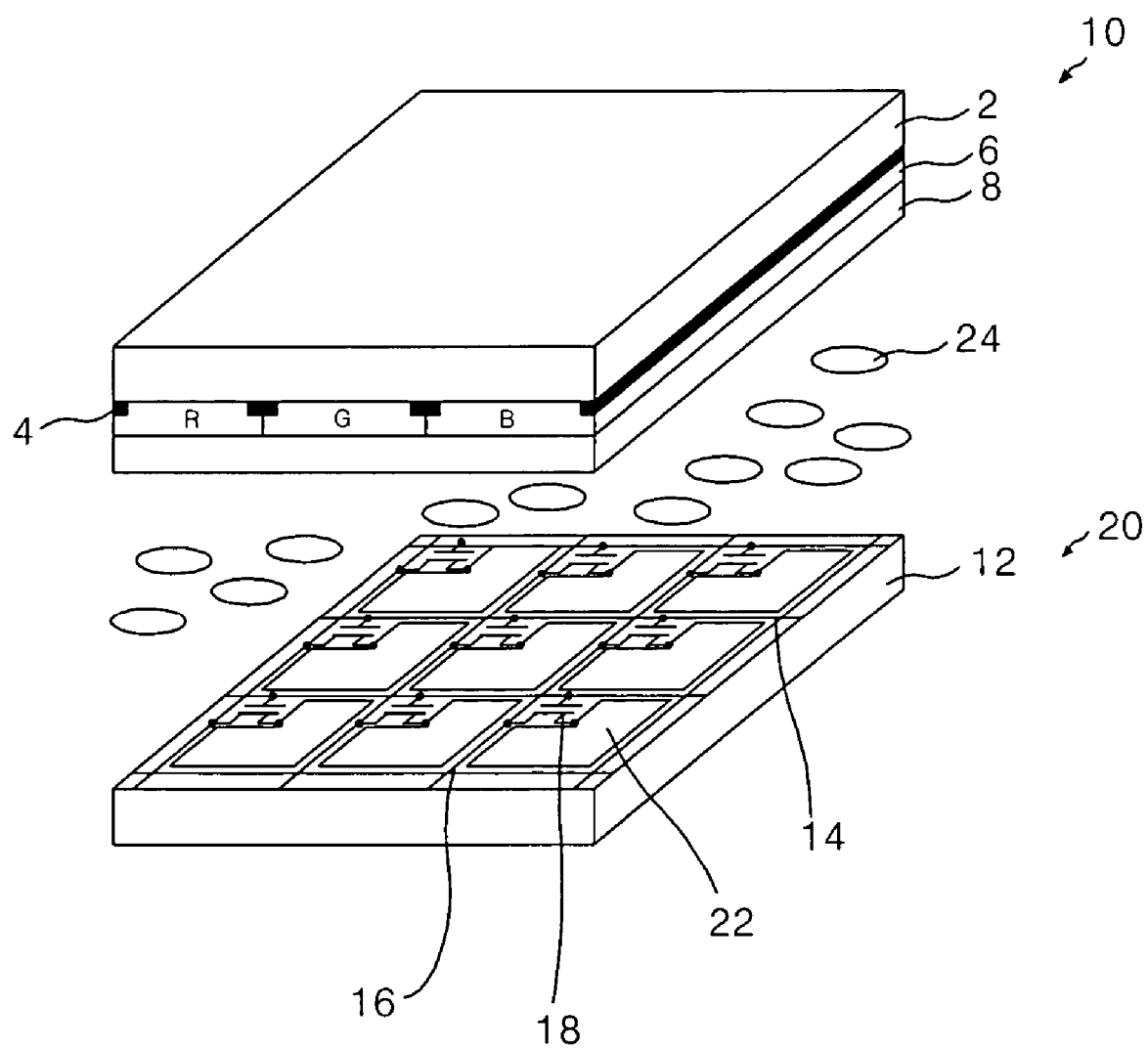
FIG. 1 is a schematic perspective view illustrating a structure of a related art liquid crystal display panel.
Figure 2:
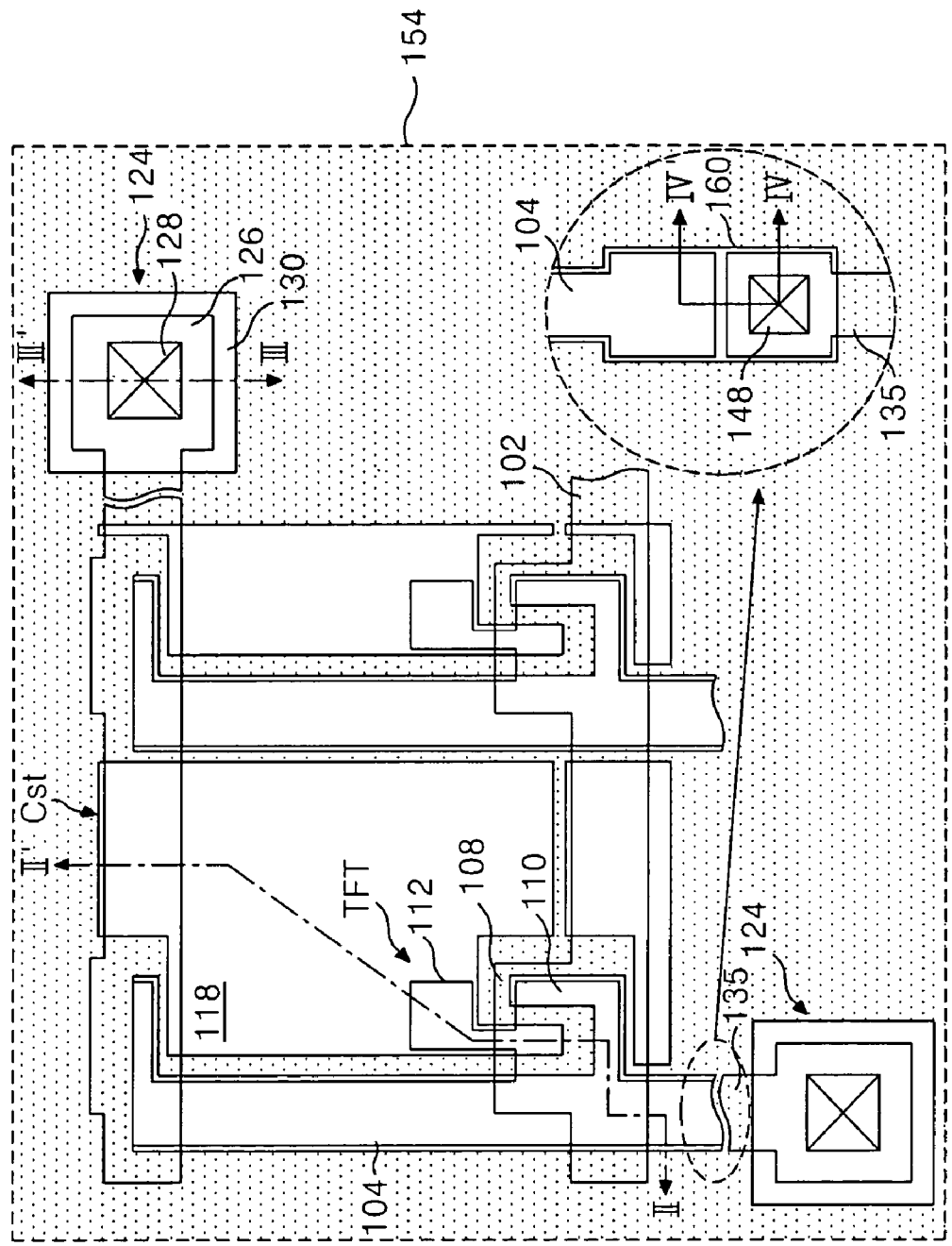
FIG. 2 is a plan view illustrating a portion of a thin film transistor substrate according to an embodiment of the present invention.

FIG. 2 is a plan view illustrating a portion of a thin film transistor substrate according to a first embodiment of the present invention, and FIG. 3A and FIG. 3B are section views of the thin film transistor substrate taken along the II–II', III–III' and IV–IV' lines in FIG. 2.

Referring to FIG. 2 and FIG. 3, the thin film transistor substrate includes a gate line 102 and a data line 104 provided on a lower substrate 150 in such a manner to cross each other with having a gate insulating film 144 there between and define a pixel area, a thin film transistor TFT connected to the gate line 102 and the data line 104, a pixel electrode 118 connected to the thin film transistor TFT, and a storage capacitor Cst provided at an overlapped portion between the pixel electrode 118 and the pre-stage gate line 102. Further, the thin film transistor substrate includes pads connected to the gate line 102, the data line 104 and a common line 120.

The gate line 102 supplies a scanning signal from a gate driver (not illustrated) while the data line 104 supplies a video signal from a data driver (not illustrated). The gate line 102 and the data line 104 cross each other with having a gate insulating film 152 there between to define the pixel area.

The gate line 102 is formed on the substrate 150 in a multiple-layer structure having at least double gate metal layers built. For instance, as illustrated in FIG. 3, the gate line 102 has a double-layer structure in which first and second gate metal layers 101 and 103 are built. The data line 104 is formed on the gate insulating film 152 in a multiple-layer structure having at least double layers including a transparent conductive layer. For instance, as illustrated in FIG. 3, the data line 104 has a double-layer structure in which a source/drain metal pattern 111 is disposed on a transparent conductive pattern 113. Herein, the transparent conductive pattern 113 is provided in such a manner to capture the source/drain metal pattern 111, thereby preventing an illumination problem caused by an exposure of the source/drain metal pattern 111.

The thin film transistor TFT allows a pixel signal on the data line 104 to be charged into the pixel electrode 118 and be kept in response to a scanning signal applied to the gate line 102. To this end, the thin film transistor TFT includes a gate electrode connected to the gate line 102, a source electrode 110 connected to the data line 104, a drain electrode 112 positioned in opposition to the source electrode 110 to be connected to the pixel electrode 118, and a semiconductor pattern 115 overlapping with the gate line 102 with having the gate insulating film 152 there between to define a channel between the source electrode 110 and the drain electrode 112. Herein, the source electrode 110 and the drain electrode 112 have a double-layer structure in which the source/drain metal pattern 111 and the transparent conductive pattern 113 are built. The semiconductor pattern 115 includes an active layer 114 forming a channel between the source electrode 110 and the drain electrode 112, and an ohmic contact layer 116 formed on the active layer 114 other than the channel portion to make an ohmic contact with the source electrode 110 and the drain electrode 112.

The pixel area defined by each crossing between the gate line 102 and the data line 104 is provided with the pixel electrode 118 connected to the drain electrode 112. Particularly, the pixel electrode 118 is extended from the transparent conductive pattern 113 of the drain electrode 112. Such a pixel electrode 118 charges a pixel signal supplied from the thin film transistor TFT to thereby generate a potential difference with respect to a common electrode provided at a color filter substrate. This potential difference rotates a liquid crystal positioned between the thin film transistor substrate and the color filter substrate owing to a dielectric anisotropy and controls an amount of a light inputted, via the pixel electrode 118, from a light source (not illustrated) to thereby transmit it into the color filter substrate.

The storage capacitor Cst is formed such that the pixel electrode 118 overlaps with the pre-stage gate line 102 with having the gate insulating film 152 there between. Herein, the pixel electrode 118 is extended from the pixel area to capture the pre-stage gate line 102. The storage capacitor Cst allows a video signal charged in the pixel electrode 118 to be stably maintained until the next signal is charged.

The gate line 102, the data line 104 and the common line 120 receive the corresponding driving signal, via the pad 124 connected to each of them, from the driving circuit. The pads 124 have the same structure. More specifically, the pad 124 includes a lower pad electrode 126, and an upper pad electrode 130 connected, via a first contact hole 128 passing through the gate insulating film 152, to the lower pad electrode 126. Herein, the lower pad electrode 126 has a double-layer structure in which the first and second gate metal layers 101 and 103 are built like the gate line 102 and the common line 120, whereas the upper pad electrode 130 has the transparent conductive pattern 113.

Thus, each of the gate line 102 and the common line 120 is connected, via the lower pad electrode 126 provided on the substrate 150 in the same structure, to the corresponding pad 124. On the other hand, the data line 104 provided on the gate insulating film 152 is connected, via a contact electrode 160, to a data link 135 extended from the corresponding lower pad electrode 126. Herein, the contact electrode 160 is extended such that the transparent conductive pattern 113 of the data line 104 overlaps with the data link 135. The contact electrode 160 is connected, via a second contact hole 148 passing through the gate insulating film 152, to the data link 135. The contact electrode 160 is extended along the data link 135 to be integral to the corresponding upper pad electrode 130.

The protective film 154 includes the pixel electrode 118, the upper pad electrode 130 and the contact electrode 160. The protective film 154 makes a border with the transparent conductive patterns 113 included in the data line 104, the source electrode 110 and the drain electrode 122. This is because the protective film 154 is formed in a state in which the photo-resist pattern used upon formation of the transparent conductive pattern 113 is left and then is patterned by lifting-off the photo-resist pattern.

Accordingly, the thin film transistor substrate according to the embodiment of the present invention having the above-mentioned structure is formed by the following three-round mask process.

Figure 4B:
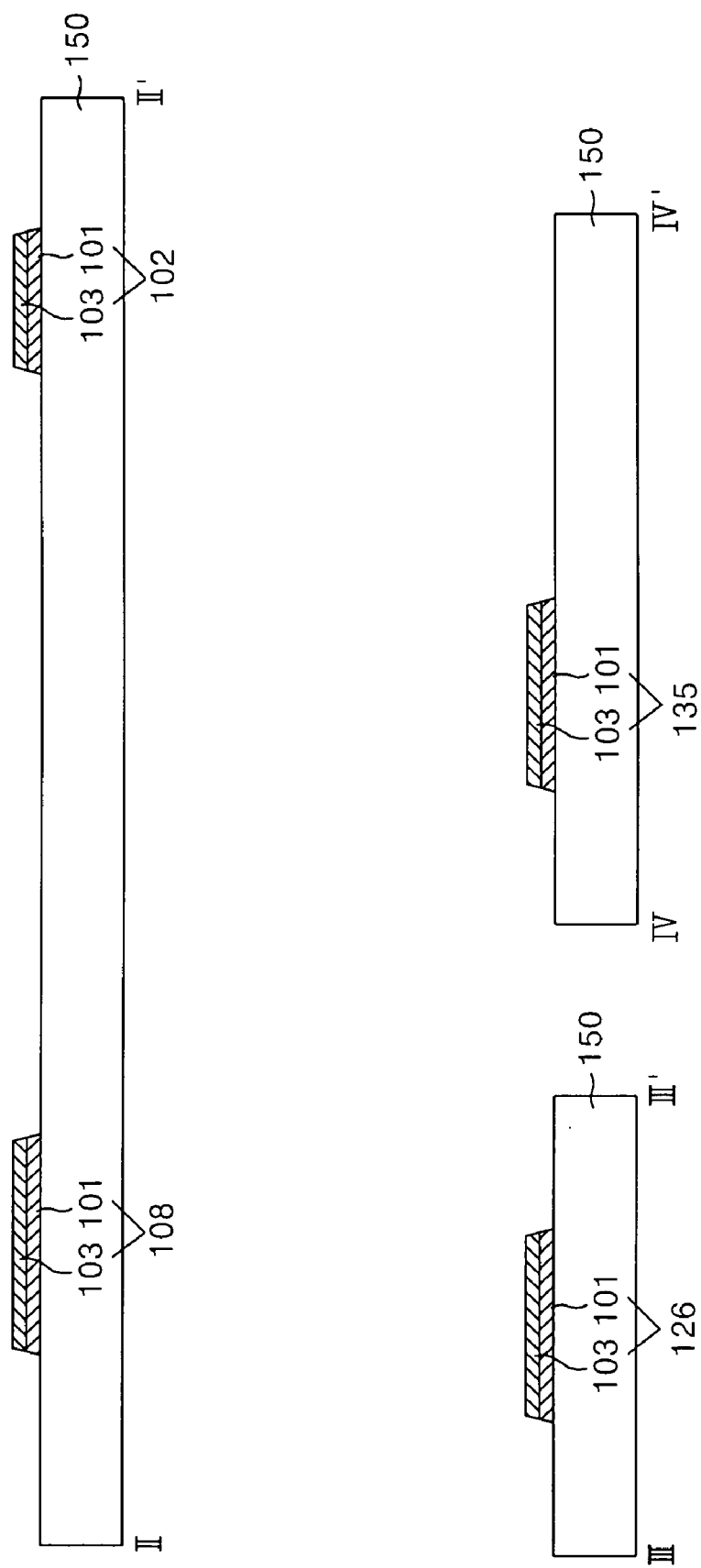

FIG. 4A and FIG. 4B are a plan view and a section view illustrating a first mask process, respectively, in a method of fabricating the thin film transistor substrate according to the embodiment of the present invention.

A first mask pattern group including the gate line 102, the gate electrode 108, the lower pad electrode 126 and the data link 135 is formed on the lower substrate 150 by the first mask process. Such a first mask pattern group has a multiple-layer structure in which at least two conductive layers are built. But, for the sake of explanation, there is described only a double-layer structure having the first and second gate metal layers built.

More specifically, the first and second gate metal layers 101 and 103 are formed on the lower substrate 150 by a deposition technique such as the sputtering, etc. Each of the first and second gate metal layers 101 and 103 is formed of a metal material such as Mo, Ti, Cu, Al, Cr, a Mo alloy, a Cu alloy or an Al alloy, etc. For example, a layer built structure of the first and second gate metal layers 101 and 103 employs Al/Cr, Al/Mo, Al(Nd)/Al, Al(Nd)/Cr, Cu/Mo, Mo/Al, Cu-alloy/Mo, Cu-alloy/Al, Cu-alloy/Mo-alloy, Cu-alloy/Al-alloy, Al/Mo alloy, Mo-alloy/Al, Al-alloy/Mo-alloy, Mo-alloy/Al-alloy or Mo/Al alloy, etc. Alternatively, it may employ a triple-layer built structure such as Ti/Al(Nd)/Ti or Mo/Ti/Al(Nd), etc. Then, the first and second gate metal layers 101 and 103 are patterned by the photolithography and the etching process using a first mask to thereby provide the first mask pattern group including the gate line 102, the gate electrode 108 and the lower pad electrode 126 and the data link 135 each of which takes a double-layer structure.

Figure 5A:
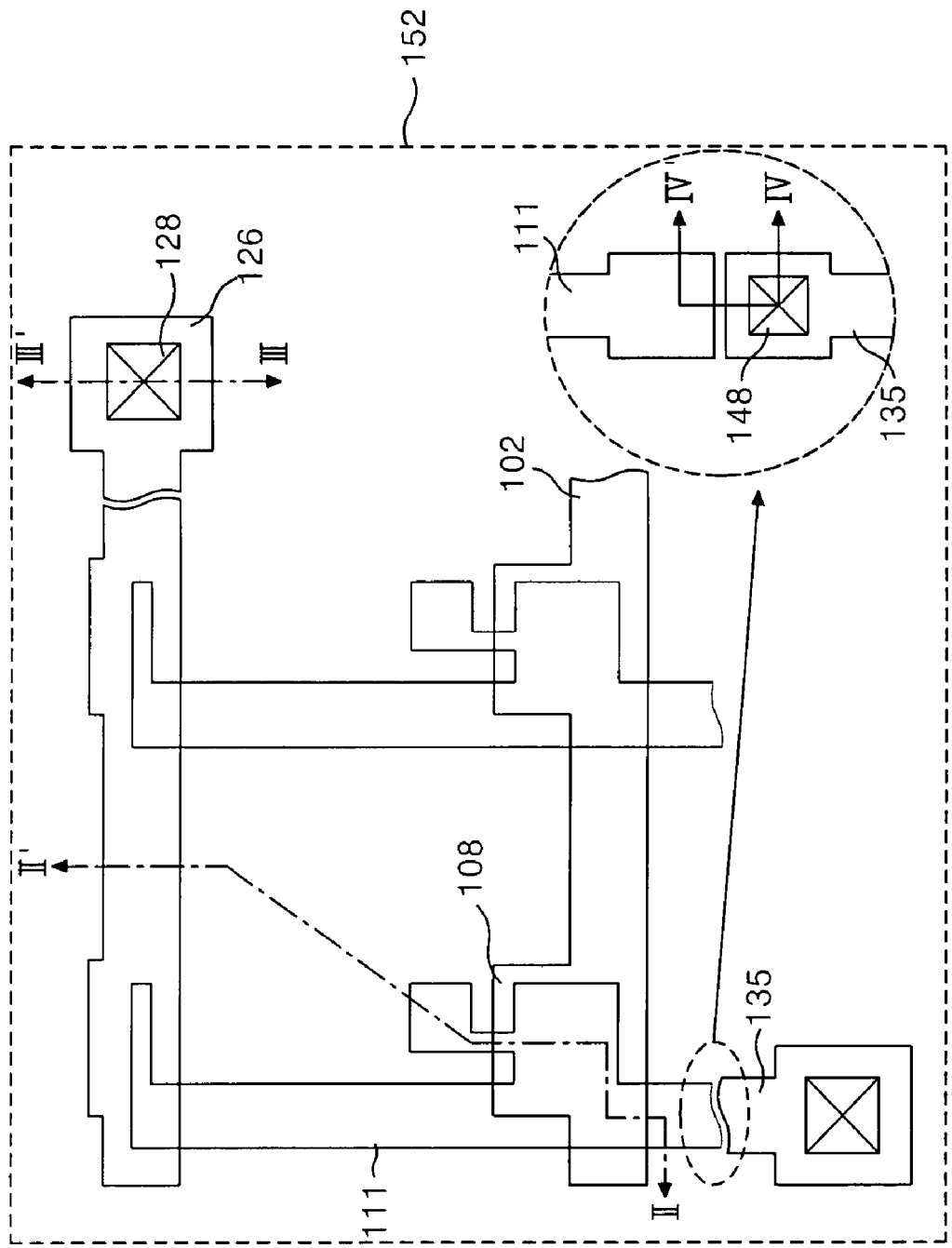
FIG. 5A and FIG. 5B are a plan view and a section view illustrating a second mask process in a method of fabricating the thin film transistor substrate according to the embodiment of the present invention, respectively.
Figure 5B:
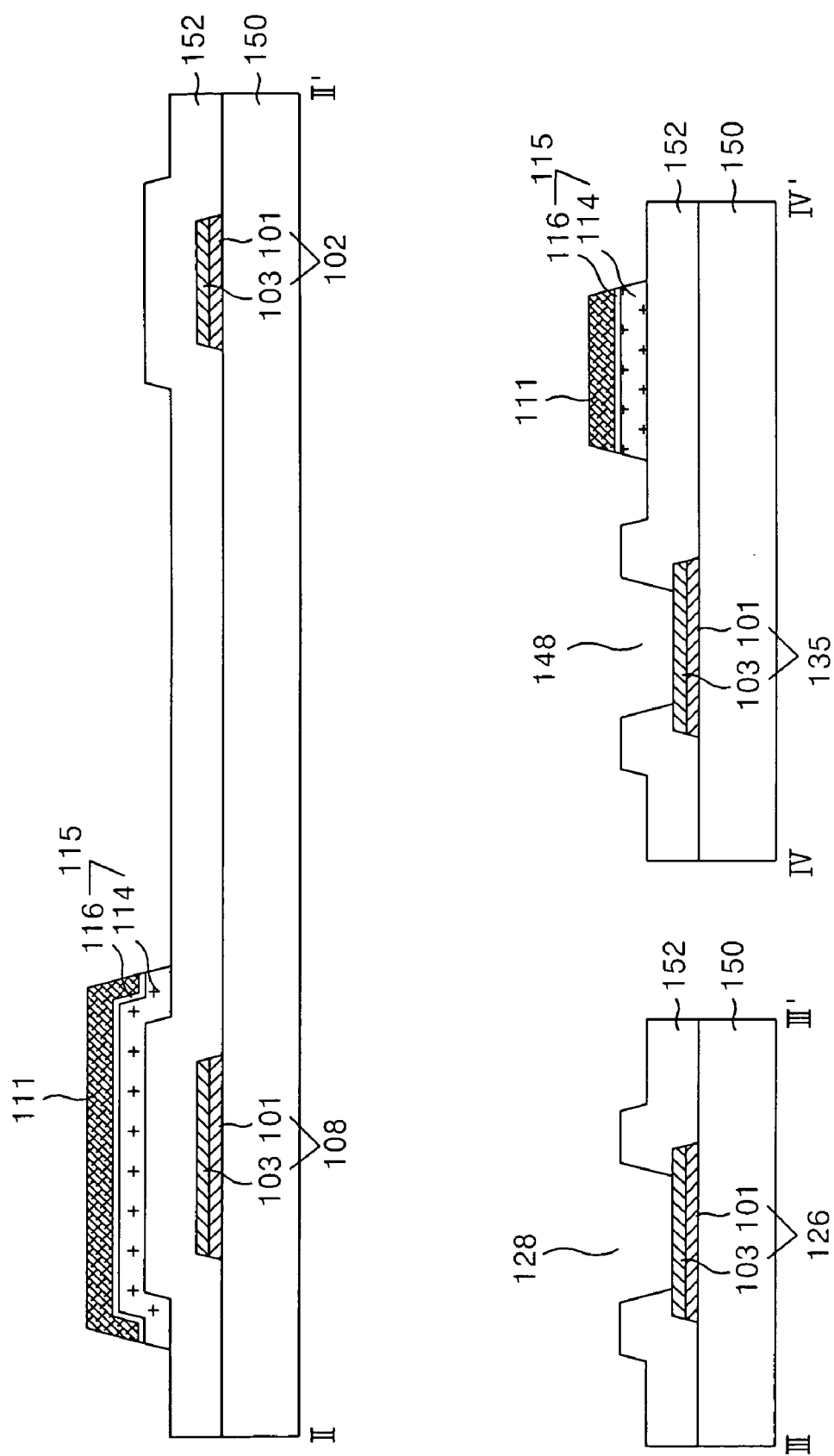

FIG. 5A and FIG. 5B are a plan view and a section view illustrating a second mask process in a method of fabricating the thin film transistor substrate according to the embodiment of the present invention, respectively, and FIG. 6A to FIG. 6F are section views for specifically explaining the second mask process.

The gate insulating film 152 having the first and second contact holes 124 and 128, the semiconductor pattern 115 and the source/drain pattern 111 are formed on the lower substrate 150 provided with the first mask pattern group by the second mask process. These are formed by a single mask process employing a diffractive exposure mask or a half tone mask. Hereinafter, a case where the half tone mask is used as a second mask will be described.

Referring to FIG. 6A, the gate insulating film 152, an amorphous silicon layer 105, an amorphous silicon layer 107 doped with an $n^+$ or $p^+$ impurity and a source/drain metal layer 109 are sequentially formed on the lower substrate 155 provided with the first mask pattern group by a deposition technique such as the PECVD, etc. Herein, the gate insulating film 152 is formed of an inorganic insulating material such as silicon nitride ($SiN_x$) or silicon oxide ($SiO_x$). The source/drain metal layer 109 employs a single layer formed of a metal material such as Mo, Ti, Cu, AlNd, Al, Cr, a Mo alloy, a Cu alloy or an Al alloy, etc., or employs a layer built structure of at least double layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu-alloy/Mo, Cu-alloy/Al, Cu-alloy/Mo-alloy, Cu-alloy/Al-alloy, Al/Mo alloy, Mo-alloy/Al, Al-alloy/Mo-alloy, Mo-alloy/Al-alloy, Mo/Al alloy, Cu/Mo alloy or Cu/Mo(Ti), etc.

Referring to FIG. 6B, a first photo-resist pattern 168 having a step coverage is formed by the photolithography using the half tone mask. The half tone mask includes a shielding part for shielding an ultraviolet ray, a half-tone transmitting part for partially transmitting the ultraviolet ray using a phase-shifting material, and a full transmitting part for fully transmitting the ultraviolet ray. The first photo-resist pattern 168 having a different thickness of photo-resist patterns 168A and 168B provided by the photolithography using the half tone mask; and the aperture part is provided. The relatively thick photo-resist pattern 168A is provided at a shielding area P1 of the first photo-resist overlapping with the shielding part of the half tone mask; the photo-resist pattern 168B thinner than the photo-resist pattern 168A is provided at a half-tone exposure part P2 overlapping with the half-tone transmitting part; and the aperture part is provided at a full exposure area P3 overlapping with the full transmitting part.

Referring to FIG. 6C, the first and second contact holes 124 and 148 passing through an area extended from the source/drain metal layer 109 until the gate insulating film 144 are formed by the etching process using a second photo-resist pattern 168 as a mask. The first contact hole 128 exposes the lower pad electrode 126, whereas the second contact hole 148 exposes the data link 135.

Referring to FIG. 6D, a thickness of the photo-resist pattern 168A is thinned and the photo-resist pattern 168B is removed by the ashing process using oxygen ($O_2$) plasma.

Referring to FIG. 6E, the source/drain metal layer 109, the amorphous silicon layer 107 doped with an impurity and the amorphous silicon layer 105 are patterned by the etching process using the ashed photo-resist pattern 168A as a mask, thereby providing the semiconductor pattern 115 having the active layer 114 and the ohmic contact layer 116 and the source/drain metal pattern 111 overlapped thereon.

Referring to FIG. 6F, the photo-resist pattern 168A left on the source/drain metal pattern 111 in FIG. 6E is removed by the stripping process.

Otherwise, a process of forming the first and second contact holes 128 and 148 and the semiconductor pattern 115 including the active layer 114 and the ohmic contact layer 116 using the first photo-resist pattern 168 as a mask may be replaced by a single of process.

Figure 7A:
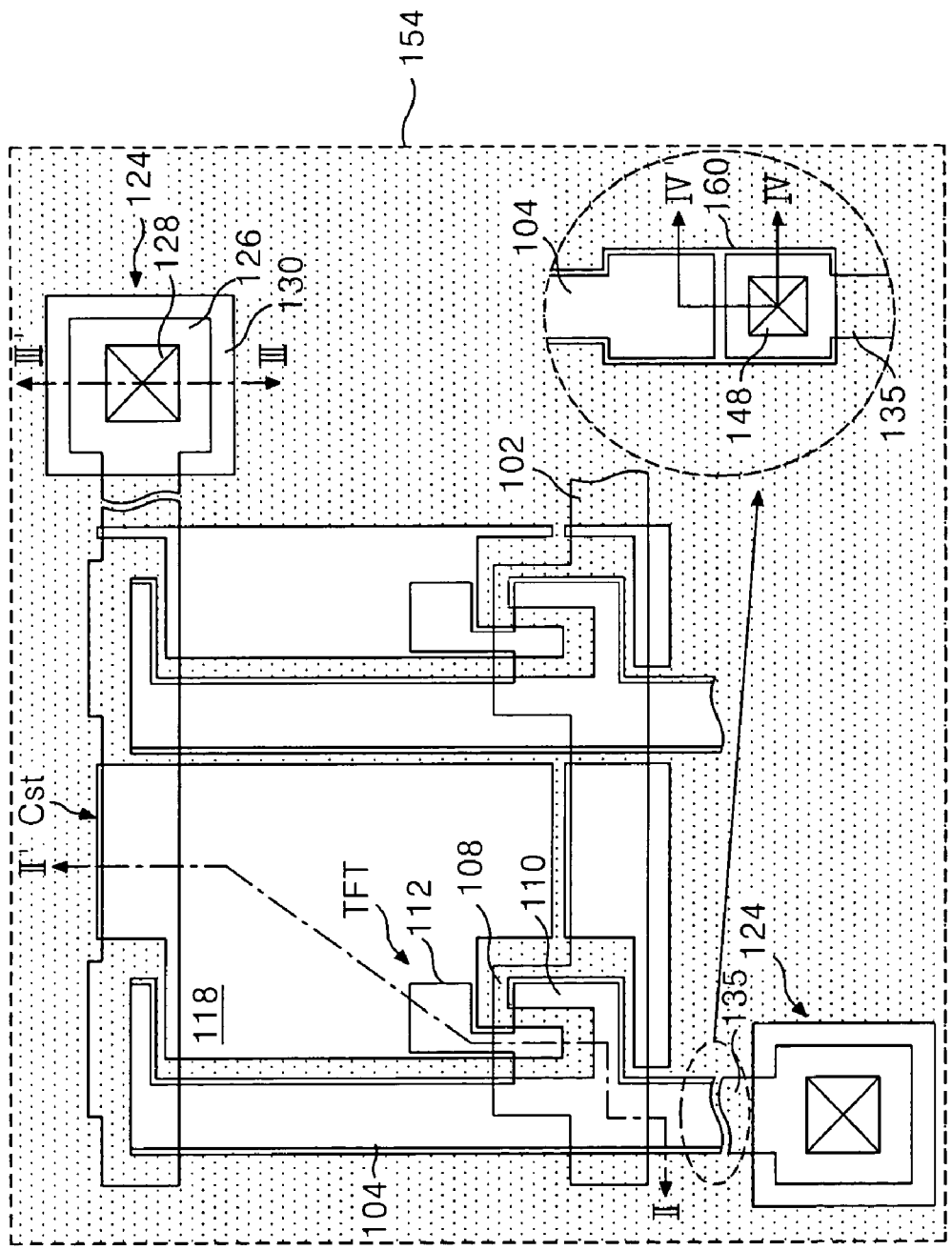

FIG. 7A and FIG. 7B are a plan view and a section view illustrating a third mask process in a method of fabricating the thin film transistor substrate according to the embodiment of the present invention, respectively, and FIG. 8A to FIG. 8E are section views for specifically explaining the third mask process.

A transparent conductive pattern 113 covering the source/drain metal pattern 111 and the protective film 154 making a border with the transparent conductive pattern 113 are formed by the third mask process. Thus, the data line 104, the source electrode 110 and drain electrode 112 having a double-layer structure in which the source/drain metal pattern 111 and the transparent conductive pattern 113 are built are provided and, at the same time, the pixel electrode 118, the upper pad electrode 130 and the contact electrode 160 having a single-layer structure of the transparent conductive pattern 113 are provided.

More specifically, as illustrated in FIG. 8A, a transparent conductive layer 117 is formed on the gate insulating film 152 provided with the source/drain metal pattern 111. The transparent conductive layer 117 is formed of ITO, TO, IZO or ITZO, etc.

Figure 8B:
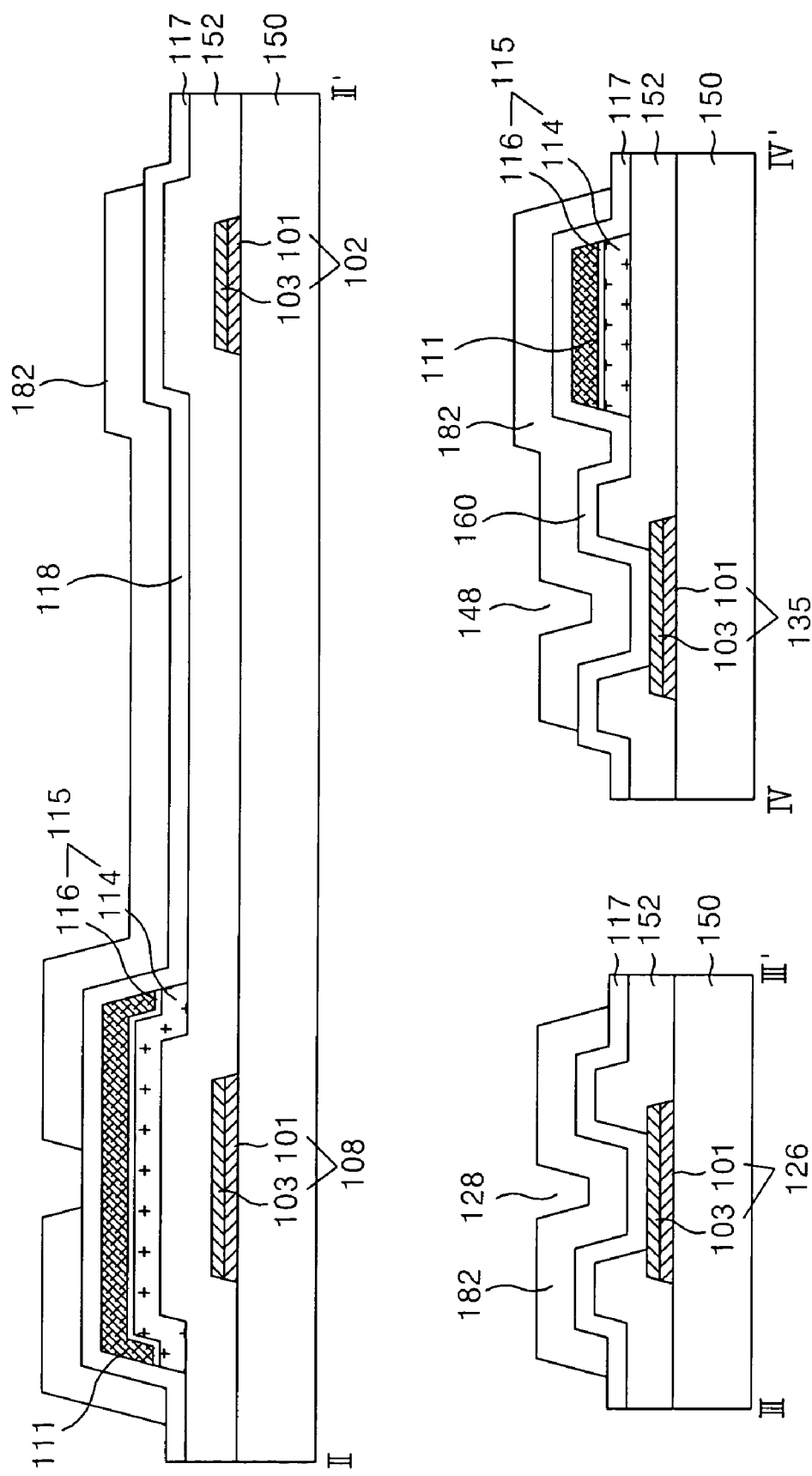

Referring to FIG. 8B, a photo-resist pattern 182 is formed on the transparent conductive layer 117 by the photolithography using a third mask.

Referring to FIG. 8C, the transparent conductive layer 117 is patterned by an etching process using the photo-resist pattern 182 as a mask, that is, a wet etching process to thereby provide the transparent conductive pattern 113 capturing the source/drain metal pattern 111. At this time, the transparent conductive pattern 113 is opened at a portion to be provided with the channel of the thin film transistor TFT. Thus, the exposed source/drain metal pattern 111 and the ohmic contact layer 116 under it are removed by an etching process using the transparent conductive pattern 113 as a mask, that is, a dry etching process, thereby allowing the active layer 114 to have an exposed structure. As a result, the data line 104, the source electrode 110 and the drain electrode 112 having a double-layer structure are provided. Further, the pixel electrode 118 extended from the transparent conductive pattern 113 of the drain electrode 112 and the contact electrode 160 extended from the transparent conductive pattern 133 of the data line 104 are provided and, at the same time, the upper pad electrode 130 connected to the lower pad electrode 126 is provided. The transparent conductive pattern 113 is over-etched in comparison with the photo-resist pattern 182.

Referring to FIG. 8D, the protective film 154 covering the photo-resist pattern 182 is entirely formed. In this case, the protective film 154 provided at the substrate in which the photo-resist pattern 182 does not exist has a structure opened with respect to the protective film 154 provided at the photo-resist pattern 182 by a spaced distance between the edge of the photo-resist pattern 182 and the edge of the transparent conductive pattern 113. Thus, an infiltration of a stripper into a portion between the photo-resist pattern 182 and the transparent conductive pattern 113 is facilitated at the next lift-off process, thereby improving lift-off efficiency. The protective film 154 is formed from an inorganic insulating material like the gate insulating film 144. Such a protective film 154 is formed by a deposition technique such as the PECVD or the sputtering, etc. But, it is desirable that the protective film 154 is formed by the sputtering in order to prevent a hardness of the photo-resist pattern 182 at a high temperature. Alternatively, the protective film 154 may be formed of an organic insulating material such as an acrylic organic compound, BCB or PFCB, etc.

Referring to FIG. 8E, the photo-resist pattern 182 illustrated in FIG. 8A and the protective film 154 provided thereon are removed by the lift-off process to thereby pattern the protective film 154. The patterned protective film 154 makes a border with the transparent conductive pattern 113. In other words, the protective film 154 making a border with the transparent conductive pattern 113 is left at the remaining area other than an area provided with the transparent conductive pattern 113.

Accordingly, a stripper infiltration between the photo-resist pattern 182 and the transparent conductive pattern 113 is facilitated at the stripping process of removing the photo-resist pattern 182 coated with the protective film 154, thereby enhancing a life-off efficiency.

As described above, according to the present invention, the semiconductor pattern and the source/drain metal pattern, along with the contact hole, are formed by utilizing a half tone (or diffractive exposure) mask in the second mask process.

Also, according to the present invention, the transparent conductive pattern is formed and the protective film is patterned by lifting off the photo-resist pattern used upon formation of the transparent conductive pattern in the third mask process. Such transparent conductive pattern and protective film protects the metal layer at the lower portion thereof, thereby preventing an illumination problem.

As a result, according to the present invention, a process can be simplified by the three-round mask process, so that it becomes possible to reduce the material cost and the equipment investment cost, etc. as well as to improve the productivity.

Although the present invention has been explained by the embodiments illustrated in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display device, comprising:
   a first mask process of forming a gate line and a gate electrode connected to the gate line on a substrate;
   a second mask process of forming a gate insulating film covering the gate line and the gate electrode and a semiconductor pattern and a source/drain metal pattern built thereon; and
   a third mask process of forming a transparent conductive pattern on a gate insulating film provided with the source/drain metal pattern and forming a protective film making an interface with the transparent conductive pattern,
   whereby a data line crossing the gate line to define a pixel area, a source electrode connected to the data line and a drain electrode opposed to the source electrode are provided in a double-layer structure in which the source/drain metal pattern and the transparent conductive pattern are built; and a pixel electrode extended from the transparent conductive pattern of the drain electrode is provided at said pixel area.

2. The method as claimed in claim 1, wherein said first mask process includes the step of forming a lower pad electrode to be connected to any one of the gate line and the data line;
   said second mask process includes the steps of forming a contact hole passing through the gate insulating film to expose the lower pad electrode; and
   said third mask process includes the step of forming an upper pad electrode to be connected, via said contact hole, to the lower pad electrode from the transparent conductive pattern.

3. The method as claimed in claim 2, wherein said first mask process includes the step of forming a data link extended from the lower pad electrode to be connected to the data line;
   said second mask process includes the step of forming a second contact hole for exposing the data link; and
   said third mask process includes the step of forming a contact electrode extended from the transparent conductive pattern of the data line to be connected, via said second contact hole, to the data link.

4. The method as claimed in claim 2, wherein the contact electrode is integral to the upper pad electrode included in the data pad.

5. The method as claimed in claim 2, wherein the upper pad electrode and the contact electrode make an interface with the protective film.

6. The method as claimed in claim 2, wherein the gate line, the gate electrode, the lower pad electrode and the data link have a multiple-layer structure in which at least two metal layers are built on the substrate.

7. The method as claimed in claim 1, wherein the transparent conductive pattern is provided in such a manner to capture the source/drain metal pattern.

8. The method as claimed in claim 3, wherein said second mask process includes the steps of:
   sequentially forming a gate insulating film covering the first mask pattern group, an amorphous silicon layer, an amorphous silicon layer doped with an impurity and a source/drain metal layer;
   forming photo-resist patterns having a different thickness by a photolithography using a half tone mask or a diffractive exposure mask; and
   forming first and second contact holes passing through an area extended from the source/drain metal layer until the gate insulating film, and the source/drain metal pattern and the semiconductor pattern by an etching process using the photo-resist pattern.

9. The method as claimed in claim 1, wherein said third mask process includes the steps of:
   forming a transparent conductive layer on the gate insulating film provided with the source/drain metal pattern;
   forming a photo-resist pattern by the photolithography;
   forming the transparent conductive pattern by an etching process using the photo-resist pattern;
   removing the source/drain metal pattern exposed through the transparent conductive pattern and an ohmic contact layer included in the semiconductor pattern under it;
   entirely forming a protective film covering the photo-resist pattern; and
   removing the photo-resist pattern provided with the protective film.

10. The method as claimed in claim 9, wherein the protective film is formed by the sputtering.

11. The method as claimed in claim 9, wherein the transparent conductive pattern is over-etched in comparison with the photo-resist pattern.

12. The method as claimed in claim 1, further comprising the step of:
   allowing the pixel electrode to overlap with the gate line with having the gate insulating film therebetween, thereby providing a storage capacitor.

* * * * *